US006664024B1

(12) United States Patent
Nguyen et al.

(10) Patent No.: US 6,664,024 B1
(45) Date of Patent: Dec. 16, 2003

(54) ORGANIC-INORGANIC HYBRID PHOTOCURABLE COMPOSITIONS

(75) Inventors: My T. Nguyen, Kirkland (CA); Vadym Nazarov, Montreal (CA)

(73) Assignee: American Dye Source, Inc., Baie D'Urfé (CA)

( * ) Notice: Subject to any disclaimer, the term of this patent is extended or adjusted under 35 U.S.C. 154(b) by 246 days.

(21) Appl. No.: 09/699,506

(22) Filed: Oct. 31, 2000

(51) Int. Cl.[7] ............................................... G03F 7/075
(52) U.S. Cl. ..................................... 430/280.1; 522/170
(58) Field of Search ....................... 430/280.1; 522/170

(56) References Cited

U.S. PATENT DOCUMENTS

| | | | |
|---|---|---|---|
| 4,465,760 A | * 8/1984 | Leyrer et al. ............... 430/325 |
| 4,882,245 A | * 11/1989 | Gelorme et al. ............. 430/14 |
| 5,302,627 A | * 4/1994 | Field et al. ................... 522/13 |
| 5,677,107 A | * 10/1997 | Neckers ...................... 430/269 |
| 5,858,544 A | * 1/1999 | Banaszak Holl et al. ... 428/447 |
| 5,942,554 A | * 8/1999 | Ren et al. ..................... 522/25 |
| 6,133,336 A | * 10/2000 | Popat et al. .................. 522/31 |
| 6,190,833 B1 | * 2/2001 | Shiota et al. ............. 430/280.1 |
| 6,200,646 B1 | * 3/2001 | Neckers et al. ............. 427/510 |
| 6,309,797 B1 | * 10/2001 | Grinevich et al. .......... 430/293 |
| 2001/0018486 A1 | * 8/2001 | Lichtenhan et al. ........ 524/588 |

OTHER PUBLICATIONS

Reade Advanced Materials offers: POSS Molecules, five pages from internett 111.read.com/products/Plymeric/poss.html, copyright 1997, Reade Avanced Materials.*

Yang et al , "Characterization of Poly(silsesquioxane by Thermal Curing", Proc. Natl. Sci, Counc. ROC (A) vol. 25, No. 6, 2001, pp. 339–343.*

Sellinger et al, "Silsesquioxanes as Synthetic Platforms, Thermally Curable and Photocurable Inorganic/Organic Hybrids", Macromolecules, 1996, vol. 29, pp. 2327–2330.*

Crivello et al, Journal of polymer Science: Part A; Polymer Chemistry, vol. 35, 407–425 (1997).*

Sellinger et al, Chemistry of Materials, vol. No. 8, Aug. 1996, pp. 1592–1593.*

* cited by examiner

*Primary Examiner*—Cynthia Hamilton
(74) *Attorney, Agent, or Firm*—Goudreau Gage Dubuc

(57) ABSTRACT

Described herein is a photocurable resin composition for stereolithography comprising (a) a photocurable component, liquid at room temperature and comprising a photopolymerizable substance selected from monomers, oligomers, dendrimers and polymers and mixtures thereof, (b) at least one photoinitiator compound, and (c) at least one photoactivated color changing compound. The color changing compound can be adapted to go from essentially colorless to a given color, one given color to another or from a given color to colorless. Optionally, the resin composition will also contain component (d), namely at least one reactive silsesquioxanes (POSS).

22 Claims, No Drawings

ORGANIC-INORGANIC HYBRID PHOTOCURABLE COMPOSITIONS

FIELD OF THE INVENTION

This invention relates to colorless photocurable compositions, which produce colored three-dimensional solid objects by stereolithographic processes. More particularly, this invention relates to photocurable compositions comprising (1) photocurable monomers, oligomers, dendrimers and polymers, (2) photoinitiators, (3) color generating compounds and optionally, (4) soluble reactive silsesquioxanes (POSS).

BACKGROUND OF THE INVENTION

U.S. Pat. Nos. 4,575,330 and 4,929,402 described a stereolithographic process, which can be employed to build up a predetermined three-dimensional object by forming series of layers of polymerized solids. The disclosure of U.S. Pat. Nos. 4,576,330 and 4,929,402 is incorporated herein by reference. During stereolithographic processing, a cross-section of the solid is traced out on the surface of a bath of liquid acrylate containing polymer precursors under the direction of a computer controlled system which causes the liquid to be exposed to a form of photoradiation such as ultraviolet or visible lasers. Exposure to photoradiation causes the liquid to polymerize and harden. After each polymerized layer is formed and solidified, it is lowered in the bath so that a new solid layer can be formed on top. This technology has been found very useful in prototyping applications, since the prototypes can be rapidly and accurately built from computer-generated graphic models.

Photocurable compositions currently used for stereolithography are known in the art. Typical photocurable compositions for application in stereolithography may contain (1) photocurable monomers, oligomers and polymers, (2) photoinitiators and (3) optional insoluble organic or inorganic fillers, which are dispersed in the composition. U.S. Pat. Nos. 5,510,226; 5,705,316 and 5,705,116 also teach to prepare photocurable compositions containing monomers and oligomers, which have functional groups such as acrylate, methacrylate, epoxy and vinyl ether.

U.S. Pat. Nos. 5,629,133 and 5,639,413 teach photocurable compositions comprising siloxane monomers, oligomers and polymers that contain epoxy functional groups.

U.S. Pat. Nos. 5,863,486 and 5,855,837 teach photocurable compositions containing inorganic fillers such as inorganic particles, whiskers, E-glass fibers, woven glass fibers, and glass beads dispersed in the photocurable mixtures.

U.S. Pat. No. 6,036,910 teaches liquid photocurable resin composition for stereolithography, which comprises a photopolymerizable compound, a photopolymerization initiator and a colorant. The photocurable composition of this prior art contains between 0.1 and 10% by weight of photopolymerization initiator and 0.05 to 0.5% by weight of the colorant. The photopolymerizable compound is in an amount of the balance, based on the total weight of these components. The photocurable composition is liquid at normal temperature.

The inventors of this invention have also found that the presence of a colorant considerably reduced the shaping speed of the stereolithographic process due to the photoradiation absorption of the colorant. Moreover, the presence of colorant was also found to deteriorate drastically the mechanical and thermal properties of the resulting three-dimensional object.

Photocurable compositions disclosed in the above prior art do not provide desired colors for the resulting solid objects. They do not provide an image print-out during stereolithography so that the three-dimensional object may be seen as it is being made. They do not provide shelf-life and pot-life color indicators. They also suffer by high degree shrinkage during photopolymerization resulting in considerable distortion in the shape of the final objects. They are relatively unstable during operation due to the settlement of the filler particles. Furthermore, the stereolithographic objects obtained from the traditionally used photocurable compositions do not have a sufficiently high glass transition temperature ($T_g$) enough to withstand functional testing as engine parts or subsequent treatment processes such as drilling, machining and sanding.

Therefore, the object of this invention is to provide photocurable compositions for application in stereolithography to produce desirable colored, three-dimensional solid objects with fast stereolithographic shaping speed, non-settlement of insoluble filler particles, low degree of distortion and superior thermal stability and superior mechanical properties. Furthermore, the object of this invention is to provide photocurable compositions for application in stereolithography that produce color image print-outs during stereolithography and in-situ shelf-life indicators.

SUMMARY OF THE INVENTION

This invention relates to colorless liquid photocurable compositions for use in the production of desirable colored three-dimensional solid objects by stereolithography. In general terms, the present invention provides a photocurable resin composition for stereolithography comprising (a) a photocurable component, liquid at room temperature and comprising a photopolymerizable substance selected from monomers, oligomers, dendrimers and polymers and mixtures thereof, (b) at least one photoinitiator compound, and (c) at least one photoactivated color generating compound. The resin composition of the present invention may also comprise functionalized reactive silsesquioxanes (POSS).

DETAILED DESCRIPTION OF THE INVENTION

This invention relates to colorless liquid photocurable compositions to produce colored three-dimensional solid objects by stereolithography. More particularly, this invention relates to photocurable compositions comprising (a) photocurable monomers, oligomers, dendrimers and polymers, (b) photoinitiators, (c) color generating compounds and optionally, (d) non-settling functionalized reactive silsesquioxanes (POSS).

Photocurable Monomers, Oligomers, Dendrimers and Polymers:

The photocurable monomers, oligomers, dendrimers and polymers of this invention may contain functional groups, such as acrylate, epoxy, methacrylate, norbonyl, styryl and vinyl ether, which are essentially colorless liquids at room temperature. The amount of the photocurable monomers, oligomers, dendrimers and polymers is between 60 and 95%.

The preferred photocurable monomers, oligomers, dendrimers and polymers containing epoxy functional groups of this invention are the materials in which the epoxide groups form part of an alicyclic or heterocyclic ring system include bis(2,3-epoxycyclopentyl) ether, 2,3-epoxycyclopentyl glycidyl ether, 1,2-bis(2,3-epoxycyclopentyloxy)ethane, bis(4-hydroxycyclohexyl)methane diglycidyl ether, 2,2-bis(4- hydroxycyclohexyl)propane diglycidyl ether, 3,4-epoxycyclohexylmethyl 3,4-epoxycyclohexanecarboxylate, 3,4-epoxy-6-methyl-cyclohexylmethyl 3,4-epoxy-6-methylcyclohexanecarboxylate, di(3,4-epoxycyclohexylmethyl)hexanedioate, di(3,4-epoxy-6-methylcyclohexylmethyl)hexanedioate, ethylenebis(3,4-epoxycyclohexane-carboxylate, ethanediol di(3,4-epoxycyclohexylmethyl)ether, vinylcyclohexene dioxide, dicyclopentadiene diepoxide or 2-(3,4-epoxycyclohexyl-5,5-spiro-3,4-epoxy)cyclohexane-1,3-dioxane.

Preferred compositions are those in which the free radically curable component contains a tri(meth)acrylate or a penta(meth)acrylate. Suitable examples of di(meth)acrylates are the di(meth)acrylates of cycloaliphatic or aromatic diols such as 1,4-dihydroxymethylcyclohexane, 2,2-bis(4-hydroxycyclohexyl)propane, bis(4-hydroxycyclohexyl)methane, hydroquinone, 4,4'-dihydroxybi-phenyl, Bisphenol A, Bisphenol F, bisphenol S, ethoxylated or propoxylated Bisphenol A, ethoxylated or propoxylated Bisphenol F or ethoxylated or propoxylated Bisphenol S. Di(meth)acrylates of this kind are known and some are commercially available.

Photoinitiator System:

A photoinitiator system according to this invention may comprise both radical and acid photoinitiators. The radical photoinitiators are employed for polymerization of materials containing acrylate, methacrylate, norbonyl and styryl functional groups. The acid photoinitiators are used for polymerization of materials containing epoxy, hydroxy and vinyl ether.

Radical photoinitiators are known in the art. Such compounds are benzoin, benzoin ethers, benzoin acetate, acetophenones, benzil, benzil ketals, anthraquinones, triphenylphosphine, benzophenones, and 1-hydroxyphenyl ketones. The preferred radical photoinitiators according to this invention are 2,2-dialkoxybenzophenones, 1-hydroxyphenylketones, benzil ketal and benzoylphosphine oxide, for example 1-hydroxycyclohexylphenyl ketone, 2-hydroxy-2,2-dimethylacetophenone, benzil dimethylketal and 2,4,6-trimethylbenzoylphosphine oxide.

Acid photoinitiators are also known in the art as described in EP-A 153 904 which include onium salts with anions having weak nucleophilicity such as $SbF_6$, $BF_4$, $PF_6$, sulfoxonium salts, for example as described in EP-A 35 969, 54 509 and 164 314, or diazonium salts, for example as described in U.S. Pat. No. 3,708,296. Other acid photoinitiators are metallocene salts, for example as described in EP-A 94 914 and 94 915.

Photoinitiators are added in effective amounts, for example in amounts of from approximately 0.1 to approximately 10% by weight each, based on the total amount of the mixture. When the mixtures according to the invention are used for stereolithographic processes, in which laser beams are commonly used, it is essential that the absorption capacity of the mixtures is so matched in terms of the type and the concentration of the photoinitiator that the curing depth at normal laser speed is approximately from 0.1 to 2.5 mm. The total amount of photoinitiators in the compositions according to the invention is preferably from 0.5 to 5% by weight.

Color Generating Compounds:

The photocurable composition of this invention may comprise color generating compounds, which are preferably colorless and soluble in the photocurable mixture.

Optionally, the color generating compound may be of a first given color which discernibly changes upon photoactivation. Also, the color generating compound could be of a given color which changes to essentially colorless upon photoactivation. All these possibilities provide the benefit of a color change resulting from photoactivation. This color change allows to see the object being created during stereolithography since the stereolithographic object has a different color when compared to the initial liquid composition. Further, the photoactivated compound acts as a shelf life and pot life indicator. When the liquid composition of the present invention is degenerated by light pollution, the color change will occur. For the purpose of the present disclosure, the expression shelf life is meant to include the pot life of the liquid composition once placed in the stereolithography bath.

Preferably, the color generating compounds are the derivatives of triarylpyridine, xanthene and isobenzofuranone. The most preferable color generating compounds of this present invention are the compounds that are colorless and which develop colors in the presence of free radical or acid. These compounds are:

3',6'-bis[N-[2-chlorophenyl]-N-methylamino]spiro[2-butyl-1,1-dioxo[1,2-benzisothiazole-3(3H),9'-(9H) xanthene]](prepared by the method of U.S. Pat. No. 4,345,017).

3',6'-bis[N-[2-[methanesulfonyl]phenyl]-N-methylamino]spiro[2-butyl-1,1-dioxo[1,2-benzisothiazole-3(3H),9'-(9H)xanthene]](prepared by the method of U.S. Pat. No. 4,345,017).

9-Diethylamino[spiro[12H-benzo(a)xanthene-12,1'(3'H)-isobenzofuran)-3'-one](available from Hilton Davis Co., Cincinnati, Ohio).

2'-di(phenylmethyl)amino-6'-[diethylamino]spiro [isobenzofuran-1(3H),9'-(9H)-xanthen]-3-one (available from Hilton Davis Co., Cincinnati, Ohio).

3-[butyl-2-methylindol-3-yl]-3-[1-octyl-2-methylindol-3-yl]-1-(3H)-isobenzofuranone (available from Hilton Davis Co., Cincinnati, Ohio).

6-[dimethylamino]-3,3-bis[4-dimethylamino]-phenyl-(3H)-isobenzofuranone (available from Hilton Davis Co., Cincinnati, Ohio).

2-[2-Octyloxyphenyl]4-[4-dimethylaminophenyl]-6-phenylpyridine (available from Hilton Davis Co., Cincinnati, Ohio).

Photocurable and Non-settling Silsesquioxane (POSS):

Surprisingly, it has been found in the course of the present invention that these compounds can be functionalized so as to become photocurable and to become soluble or at least dispersible in the resin composition of the present invention. Silsesquioxanes can provide advantageous mechanical properties such as hardness and modulus to the finished stereolithographic object.

The photocurable compositions described this invention may thus comprise polyhedral oligomeric silsesquioxanes (POSS) having a chemical structure according to Formula I, below, where R can be alkyl, cycloalkyl, alkoxy, aryl, polyether, dimethylsiloxane and polyether. These substituent are preferred to contain reactive functional groups, such as acrylate, alcohol, epoxy, methacrylate, styryl and vinyl ether, which can undergo polymerization in the presence of free radical or acid.

Formula I

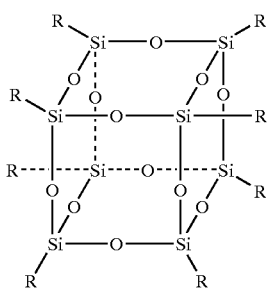

The functionalized silsesquioxanes according to this invention are non-settling in the photocurable composition. This means that the functionalized silsesquioxanes may be soluble or dispersible in the photocurable compositions.

The syntheses of the functionalized silsesquioxanes of this invention are commercially available or they were synthesized according to the procedure published by C. Bolln et. al., Chem. Mat. Vol. 9, No. 6, 1997, pages 1475–1479. A review about silsesquioxanes can be found in Chem. Rev. 1995, 95, 1409–1430.

The preferred soluble reactive silsesquioxane of this invention are:

3-(3,5,7,9,11,13,15-Heptacyclopentylpentacyclo [$9.5.1.1^{3,9}.1^{5,15}.1^{7,13}$]octasiloxan-1-yl)propyl methacrylate (available from Aldrich Chemical, Oakville, Ontario).

3-(3,5,7,9,11,13,15-Heptacyclopentylpentacyclo [$9.5.1.1^{3,9}.1^{5,15}.1^{7,13}$]octasiloxan-1-yl)propyl epoxy (available from Hybrid Plastics, Fountain Valley, Calif.).

1-[2-(5-Norbornen-2-yl)ethyl]-3-(3,5,7,9,11,13,15-heptacyclopentylpentacyclo-[$9.5.1.1^{3,9}.1^{5,15}.1^{7,13}$] octasiloxane (available from Aldrich Chemical, Oakville, Ontario).

1,3,5,7,9,1,13-octakis(2(2-(2-hydroxy)ethoxy)ethoxy) pentacyclo-[$9.5.1.1^{3,9}.1^{5,15}1.^{7,13}$]octasiloxane (available from American Dye Source, Inc., Mount Royal, Quebec).

1,3,5,7,9,11,13-octakis(2(2-hydroxy)ethoxy)pentacyclo-[$9.5.1.1^{3,9}.1^{5,15}.1^{7,13}$]-octasiloxane (available from American Dye Source, Inc., Mount Royal, Quebec).

1,3,5,7,9,11,13-octakis(2-hydrobutyldimethylsilylpentacyclo-[$9.5.1.1^{3,9}.1^{5,15}.1^{7,13}$]octasiloxane (available from Hybrid Plastics, Fountain Valley, Calif.).

1,3,5,7,9,11,13-octakis(hydroxypropyl-1,2-butoxylate-block-ethoxylate)-pentacyclo[$9.5.1.1^{3,9}.1^{5,15}.1^{7,13}$] octasiloxane (available from American Dye Source, Inc., Mount Royal, Quebec).

1,3,5,7,9,11,13-octakis(3-hydroxypropyldimethylsilyloxy)pentacyclo[$9.5.1.1^{3,9}.1^{5,15}.1^{7,13}$]octasiloxane (available from American Dye Source, Inc., Mount Royal, Quebec).

1-(2-hydroxyethoxylate-block-1,2-butoxylatepropyl)3,5,7,9,11,13-heptacyclopentylpentacyclo-[$9.5.1.1^{3,9}.1^{5,15}.1^{7,13}$]octasiloxane (available from American Dye Source, Inc., Mount Royal, Quebec).

PREPARATION OF PHOTOCURABLE COMPOSITONS

The colorless liquid photocurable compositions of this present invention were prepared by mixing all the ingredients at room temperature in a mixing apparatus, which is equipped with stainless steel vat and a mechanical stirrer. After all the components have been dissolved, the photocurable composition was filtered through 1.0 $\mu$m absolute filter to remove any solid residue. The three-dimensional solid object parts were built using SLA 3500 stereolithography machine from 3D Systems (Valencia, Calif.).

| Ingredients | Example 1 (Weight %) | Example 2 (Weight %) | Example 3 (Weight %) | Example 4 (Weight %) |
|---|---|---|---|---|
| Celloxide 2021P | 24.23 | 24.23 | 24.23 | 24.23 |
| Celloxide 2081 | 21.23 | 22.23 | 22.23 | 24.23 |
| POSS2020 | 2.00 | 2.00 | 2.00 | 2.00 |
| SR351 | 12.25 | 12.25 | 12.25 | 12.25 |
| Epotech YD128 | 12.25 | 12.25 | 12.25 | 12.25 |
| Placcel 303 | 19.42 | 19.42 | 19.42 | 19.42 |
| Cyracure UVI6974 | 5.6 | 5.6 | 5.6 | 5.6 |
| Irgacure 184 | 2 | 2 | 2 | 2 |
| ITX | 0.0125 | 0.0125 | 0.0125 | 0.0125 |
| Copikem 35 | | 0.0125 | | |
| Copikem 1 Blue, CVL | | | 0.0125 | |
| Copikem 37 | | | | 0.0125 |

Celloxide 2021P is alicyclic diepoxide, which is available from Daicel USA Inc. (Fort Lee, N.J., USA).

Celloxide 2081 is polycaprolactone diepoxy, which is available from Daicel USA Inc. (Fort Lee, N.J., USA).

POSS2020 is 1,3,5,7,9,11,13-octakis(hydroxypropyl-1,2-butoxylate-block-ethoxylate)-pentacyclo[$9.5.1.1^{3,9}.1^{5,15}.1^{7,13}$]octasiloxane, which is available from American Dye Source, Inc., (Mount Royal, Quebec, Canada).

SR351 is trimethylolpropane triacrylate, which is available from Satomers Company Inc. (Exton, Pa., USA).

Epotech YD128 is bisphenol A diglycidyl ether, which is available from Van Waters & Rogers Ltd. (Montreal, Quebec, Canada).

Placcel 303 is polycaprolactonetriol, which is available from Daicel USA Inc. (Fort Lee, N.J., USA).

Cyracure UVI6974 is a mixture of triaryl sulfonium hexafluoroantimonate salts, which is available from Union Carbide (Danbury, Conn., USA).

Irgacure 184 is 1-hydroxy-cyclohexyl phenyl ketone, which is available from Ciba Specialty Chemicals (Mississauga, Ontario, Canada).

ITX is a mixture of 2-isopropylthioxanthone and 4-isopropylthioxanthone, which is available from Lambson (Castleford, West Yorkshire, United Kingdom).

Copikem 35 is 3-[butyl-2-methylindol-3-yl]-3-[1-octyl-2-methylindol-3-yl]-1-(3H)-isobenzofuranone, which is available from Hilton Davis Co. (Cincinnati, Ohio, USA).

Copikem 37 is 2-[2-octyloxyphenyl]-4-[4-dimethylaminophenyl]-6-phenylpyridine, which is available from Hilton Davis Co., Cincinnati, Ohio, USA.

Copikem 1 Blue, CVL is 6-(dimethylamino)-3,3-bis(4-dimethylamino)phenyl-(3H)-isobenzofuranone, which is available from Hilton Davis Co., Cincinnati, Ohio, USA.

| Parameters | Method | Example 1 | Example 2 | Example 3 | Example 4 |
|---|---|---|---|---|---|
| Viscosity at 30° C. (cPs) | Brookfield | 280 | 278 | 280 | 278 |
| Critical exposure (mJ/cm$^2$) | Window-panes | 8 | 8 | 8 | 8 |
| Penetration depth (mils) | Window-panes | 6.1 | 6.1 | 6.1 | 6.1 |
| Color of solid object | Visual | Colorless | Magenta | Cyan | Yellow |
| Tensile strength (MPa) | ASTM D 638M | 23.15 | 22.64 | 23.10 | 23.80 |
| Tensile modulus (MPa) | ASTM D 638M | 1593 | 1480 | 1600 | 1520 |
| Elongation @ break (%) | ASTM D 638M | 89.8 | 87.1 | 91.8 | 90.2 |
| Flexural strength (MPa) | ASTM D 790M | 32.8 | 31.4 | 30.4 | 30.9 |
| Flexural modulus (MPa) | ASTM D 790M | 699.63 | 701.85 | 698.43 | 700.3 |
| Impact strength (J/m) | ASTM D 256M | 40 | 39 | 38 | 40 |
| Hardness (Shore D) | ASTM D 2240 | 85 | 83 | 83 | 85 |

These tests clearly show that the inventive composition and its method of preparation provide photocurable resin compositions having improved mechanical properties over the prior art and having tailor made colors.

We claim:

1. A photocurable resin composition for stereolithography wherein said resin composition is a color-shifting composition upon being subjected to photocuring, said resin composition comprising:
    (a) a photocurable component, liquid at room temperature and comprising a photopolymerizable substance selected from monomers, oligomers, dendrimers and polymers and mixtures thereof, said photopolymerizable substance consisting of:
    bis(2,3-epoxycyclopentyl)ether,
    2,3-epoxycyclopentyl glycidyl ether,
    1,2-bis(2,3-epoxycyclopentyloxy)ethane,
    bis(4-hydroxycyclohexyl)methane diglycidyl ether,
    2,2-bis(4-hydroxycyclohexyl)propane diglycidyl ether,
    3,4-epoxycyclohexyl-methyl-3,4-epoxycyclohexanecarboxylate,
    3,4-epoxy-6-methyl-cyclohexylmethyl-3,4-epoxy-6-methylcyclohexane-carboxylate,
    di(3,4-epoxycyclohexylmethyl)haxanedioate,
    di(3,4-epoxy-6-methylcyclohexylmethyl) hexanedioate,
    ethylenebis(3,4-epoxycyclohexanecarboxylate,
    ethanediol di(3,4-epoxycyclohexylmethyl)ether,
    vinylcyclohexene dioxide,
    dicyclopentadiene diepoxide, or
    2-(3,4-epoxycyclohexyl-5,5-spiro-3,4-epoxy) cyclohexane-1,3-dioxane;
    (b) at least one photoinitiator compound,
    (c) at least one photoactivated color changing compound and
    (d) at least one functionalized reactive polysilsesquioxane compound wherein said polysilsesquioxane compound is functionalized so as to be photocurable and therefore capable of becoming solid and further functionalized so as to be soluble or dispersible and non-settling in the said resin composition.

2. The resin composition of claim 1 wherein said composition is a solution of components (a) (b) (c) and (d).

3. The resin composition of claim 1 wherein said photopolymerizable substance is present in a proportion of about 60 to about 95% by weight based on the weight of the resin composition.

4. The resin composition of claim 1 wherein said photoinitiator is selected from the group of photoiniators consisting of: benzoin, benzoin ethers, benzoin acetate, acetophenones, benzil, benzil ketals, anthraquinones, triphenylphosphine, benzophenones, and 1-hydroxyphenyl ketones.

5. The resin composition of claim 4 wherein said photoinitiator is: 2,2-dialkoxybenzophenones, 1-hydroxyphenylketones, benzil ketal and benzoylphosphine oxide, for example 1-hydroxycyclohexylphenyl ketone, 2-hydroxy-2,2-dimethylacetophenone, benzil dimethylketal or 2,4,6-trimethylbenzoylphosphine oxide.

6. The resin composition of claim 1 wherein said photoinitiator is selected from the group of photoinitiators consisting of:
    onium salts with anions having weak nucleophilicity, sulfoxonium salts, diazonium salts, and metallocene salts.

7. The resin composition of claim 1 wherein said photoinitiators are present in proportions of about 0.1 to about 10% by weight based on the weight of the resin composition.

8. The resin composition of claim 1 wherein said said photoinitiators are present in proportions of about 0.5 to about 5% by weight based on the weight of the resin composition.

9. The resin composition of claim 1 wherein the photocurable resin composition has a photoradiation absorption level so that under response from a given photoradiation source it will become polymerized and consequently solidified to a curing depth of about 0.1 to about 2.5 mm.

10. The resin composition of claim 1 wherein the at least one photoactivated color generating compound is essentially colorless and soluble in the photocurable resin composition.

11. The resin composition of claim 10 wherein the photoactivated color changing compound is a shelf life indicator for the resin composition.

12. The resin composition of claim 1 wherein the at least one photoactivated color changing compound is of a first color prior to photoactivation and of a second color, discernible by visual inspection from the first color, after photoactivation.

13. The resin composition of claim 12 wherein the photoactivated color changing compound is a shelf life indicator for the resin composition.

14. The resin composition of claim 1 wherein the at least one photoactivated color changing compound is of a first color prior to photoactivation and esentially colorless after photoactivation.

15. The resin composition of claim 14 wherein the photoactivated color changing compound is a shelf life indicator for the resin composition.

16. The resin composition of claim 1 wherein the photoactivated color changing compound is selected from the group of compounds consisting of:
    derivatives of triarylpyridine, xanthene, isobenzofuranone and mixtures thereof.

17. The resin composition of claim 16 wherein the photoactivated color changing compound is:
    3',6'-bis[N-[2-chlorophenyl]-N-methylamino]spiro[2-butyl-1,1-dioxo[1,2-benzisothiazole-3(3H),9'-(9H) xanthene]],
    3',6'-bis[N-[2-[methanesulfonyl]phenyl]-N-methylamino]spiro[2-butyl-1,1-dioxo[1,2-benzisothiazole-3(3H),9'-(9H)xanthene]], 9-Diethylamino[spiro[12H-benzo(a)xanthene-12,1'(3'H) isobenzofuran)-3'-one], 2'-di(phenylmethyl)amino-6'-[diethylamino]spiro [isobenzofuran-1(3H),9'-(9H)-xanthen]-3-one, 3-[butyl-2-methylindol-3-yl]-3-[1-octyl-2-methylindol-3-yl]-1-(3H)-isobenzofuranone 6-[dimethylamino]-3,3-bis[4-dimethylamino]-phenyl-(3H)-isobenzofuranone or 2-[2-octyloxyphenyl]-4-[4-dimethylaminophenyl]-6-phenylpyridine.

18. The resin composition of claim 1 wherein said at least one reactive polysilsesquioxanes is represented by formula I below:

Formula I:

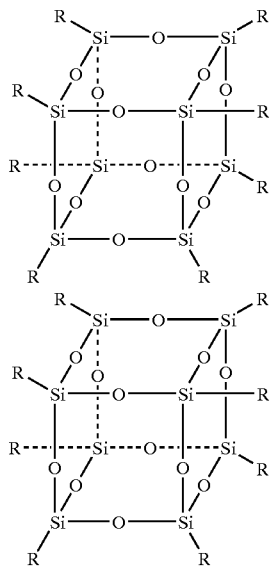

where R is alkyl, cycloalkyl, alkoxy, aryl, dimethylsiloxane or polyether.

19. The resin composition of claim 1 wherein said at least one reactive polysilsesquioxanes is represented by formula I below:

Formula I:

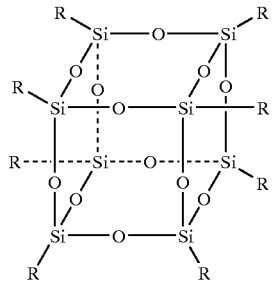

-continued

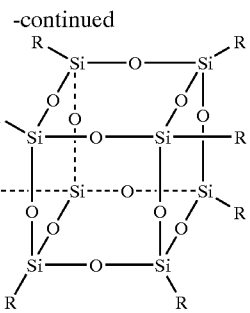

where R contains reactive functional groups selected from the group of functional groups consisting of: acrylate, alcohol, epoxy, methacrylate, styryl and vinyl ether, said reactive functional group capable of undergoing cross-polymerization in the presence of radical or acid initiators.

20. The resin composition of claim 19 wherein said functionalized silsesquioxanes are:

3-(3,6,7,9,11,13,15-heptacyclopentylpentacyclo[9.5.1. $1^{3,9}.1^{5,15}.1.^{7,13}$]octasiloxan-1-yl)propyl methacrylate, 3-(3,5,7,9,11,13,15-Heptacyclopentylpentacyclo [9.5.1.$1^{3,9}.1^{5,15}.1.^{7,13}$]octasiloxan-1-yl)propyl epoxy, 1-[2-(5-Norbornen-2-yl)ethyl]-3-(3,5,7,9,11,13,15-heptacyclopentylpentacyclo-[9.5.1.$1^{3,9}.1^{5,15}.1.^{7,13}$] octasiloxane, 1,3,5,7,9,11,13-octakis(2(2-(2-hydroxy)ethoxy)ethoxy) pentacyclo-[9.5.1.$1^{3,9}.1^{5,15}.1^{7,13}$]octasiloxane, 1,3,5,7,9,11,13-octakis(2(2-hydroxy)ethoxy)pentacyclo-[9.5.1.$1^{3,9}.1^{5,15}.1.^{7,13}$]-octasiloxane, 1,3,5,7,9,11,13-octakis(2-hydrobutyldimethylsilylpentacyclo)-[9.5.1. $1^{3,9}.1^{5.15}.1^{7,13}$]octasiloxane, 1,3,5,7,9,11,13-octakis(hydroxypropyl-1,2-butoxylate-block-ethoxylate)-pentacyclo-[9.5.1.$1^{3,9}.1^{5.15}.1^{7,13}$] octasiloxane, 1,3,5,7,9,11,13-octakis(3-hydroxypropyldimethylsilyloxy)pentacyclo[9.5.1. $1^{3,9}.1^{5.15}.1^{7,13}$]octasiloxane or 1-(2-hydroxyethoxylate-block-1,2-butoxylatepropyl)3,5,7,9,11,13-heptacyclopentylpentacyclo-[9.5.1. $1^{3,9}.1^{5.15}.1^{7,13}$]octasiloxane.

21. A method a preparing the photocurable resin composition of claim 1, said method comprising the steps of:

mixing components (a), (b), (c) and (d) at room temperature in a mixing apparatus;

and filtering the resulting photocurable resin composition to remove solid particles having a diameter exceeding a predetermined value.

22. The method of claim 21 wherein said predetermined value is 1 $\mu$m.

* * * * *

UNITED STATES PATENT AND TRADEMARK OFFICE
CERTIFICATE OF CORRECTION

PATENT NO. : 6,664,024 B1
DATED : December 16, 2003
INVENTOR(S) : My T. Nguyen and Vadym Nazarov It is certified that error appears in the above-identified patent and that said Letters Patent is hereby corrected as shown below:

Column 8,
Line 25, the second occurrence of word "said" is deleted.
Claim 8 now reads:
-- 8. The resin composition of claim 1 wherein said photoinitiators are present in proportions of about 0.5 to about 5% by weight based on the weight of the resin composition. --

Column 9,
Line 13, Claim 18 should read as follows:
-- 18. The resin composition of claim 1 wherein said at least one reactive polysilsesquioxanes is represented by formula 1 below:

Formula I:

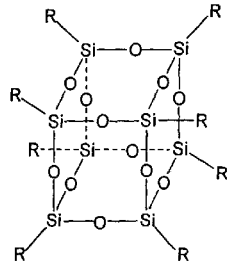

where R is alkyl, cycloalkyl, alkoxy, aryl, dimethylsiloxane or polyether. --

Line 43, Claim 19 should read as follows:
-- 19. The resin composition of claim 1 wherein said at least one reactive polysilsesquioxanes is represented by formula 1 below:

Formula I:

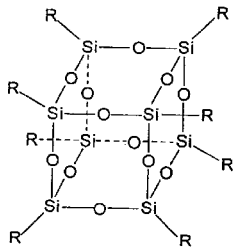

UNITED STATES PATENT AND TRADEMARK OFFICE
CERTIFICATE OF CORRECTION

PATENT NO.    : 6,664,024 B1
DATED         : December 16, 2003
INVENTOR(S)   : My T. Nguyen and Vadym Nazarov It is certified that error appears in the above-identified patent and that said Letters Patent is hereby corrected as shown below:

Column 9 (cont'd),
where R contains reactive functinal groups selected from the group of functional groups consisting of:
Acrylate, alcohol, epoxy, methacrylate, styryl and vinyl ether, said reactive functional group capable of undergoing cross-polymerization in the presence of radical or acid initiators. --

Column 10,
Line 23, should read:
-- 3-(3,5,7,9,11,13,15-heptacyclopentylpentacyclo[9.5.1. --.
Line 48, Claim 21 should read:
-- 21. A method of preparing the photocurable resin composition of claim 1, said method comprising the steps of:
    mixing components (a), (b), (c) and (d) at room temperature in a mixing apparatus; and filtering the resulting photocurable resin composition to remove solid particles having a diameter exceeding a predetermined value. --

Signed and Sealed this

Seventeenth Day of August, 2004

JON W. DUDAS
*Acting Director of the United States Patent and Trademark Office*